US006519374B1

(12) United States Patent
Stook et al.

(10) Patent No.: US 6,519,374 B1
(45) Date of Patent: Feb. 11, 2003

(54) PREDISTORTION ARRANGEMENT USING MIXERS IN NONLINEAR ELECTRO-OPTICAL APPLICATIONS

(75) Inventors: Christopher Robert Stook, North Wales, PA (US); Stephen Bradley Krasulick, Fogelsville, PA (US)

(73) Assignee: Uniphase Corporation, San Jose, CA (US)

( * ) Notice: Subject to any disclaimer, the term of this patent is extended or adjusted under 35 U.S.C. 154(b) by 0 days.

(21) Appl. No.: 09/281,235

(22) Filed: Mar. 30, 1999

(51) Int. Cl.[7] .......................... G02F 1/035; H04B 10/04
(52) U.S. Cl. ............................... 385/2; 385/1; 385/14; 385/24; 385/122; 359/161; 359/180; 359/181
(58) Field of Search ........................... 385/1, 2, 3, 14, 385/24, 31, 88, 89, 92, 122; 359/180, 181, 161, 153, 132, 124

(56) References Cited

U.S. PATENT DOCUMENTS

| 4,992,754 A | | 2/1991 | Blauvelt et al. | ............. 330/149 |
| 5,252,930 A | | 10/1993 | Blauvelt | ............. 330/149 |
| 5,327,279 A | | 7/1994 | Farina et al. | ............. 359/180 |
| 5,570,063 A | * | 10/1996 | Eisenberg | ............. 330/149 |

FOREIGN PATENT DOCUMENTS

| DE | 2306294 | 5/1974 | ............. 359/180 X |
| DE | 3307309 | 9/1984 | ............. 359/180 X |
| DE | 4120029 | 12/1992 | ............. 359/180 X |
| EP | 0594344 | 4/1994 | ............. 359/180 X |
| FR | 2713851 | 6/1995 | ............. 359/180 X |

OTHER PUBLICATIONS

Hewlett Packard, IAM–8 Series Active Mixers, Application Note S013, Hewlett Packard Corporate Product Publication, (No date).

Hewlett Packard, Silicon Bipolar MMIC 5 GHz Active Double Balanced Mixer/IF Amp, Technical Data, Hewlwtt Packard Corporate Product Publication, (No date).

Manfred Bertelsmeier and Willmut Zschunke, Linearization of Broadband Optical Transmission Systems by Adaptive Predistortion, Sep. 1984, Frequenz.

* cited by examiner

*Primary Examiner*—Brian Healy (57) ABSTRACT

A predistortion arrangement is described for using an input signal to drive a nonlinear device having a drive input. Initially, first means sample a portion of the input signal. The sampled portion of the input signal is introduced to at least one predistortion path including a mixer responsive to the sampled portion of the input signal for producing at least second order intermodulation products of the input signal. The second order intermodulation products are conditioned. Combining means then combine the conditioned second order intermodulation products with the sampled input signal in a way which produces a predistorted drive signal compensated for second order distortion for use in driving the drive input of the nonlinear device. In one aspect, the sampling means and the combining means may be provided using resistive networks. The use of the resistive networks eliminates the need for directional couplers incorporating magnetic components. Accordingly, the predistortion arrangement including the mixer and the resistive networks may be provided in the form of an integrated circuit.

21 Claims, 4 Drawing Sheets

PREDISTORTION ARRANGEMENT USING MIXERS IN NONLINEAR ELECTRO-OPTICAL APPLICATIONS

BACKGROUND OF THE INVENTION

The present invention relates generally to predistortion compensation in nonlinear electro-optical applications and, more particularly, to a predistortion arrangement which includes at least one mixer for producing second or higher order intermodulation products which are useful in distortion compensation. The invention is particularly well suited for production in integrated circuit form.

Nonlinear distortion is problematic in the use of nonlinear electro-optical devices such as, for example, lasers and modulators. One prior art approach, as described in U.S. Pat. No. 4,992,754, issued to Blauvelt et al., relies on predistorting an input signal in an attempt to counteract the nonlinearity of the electrooptical device in a way which is intended to provide an overall linear transfer function. As described by the '754 patent, prior art techniques generally divide an input signal along two or more electrical paths and generate predistortion along one or more of the paths.

Figure 1:
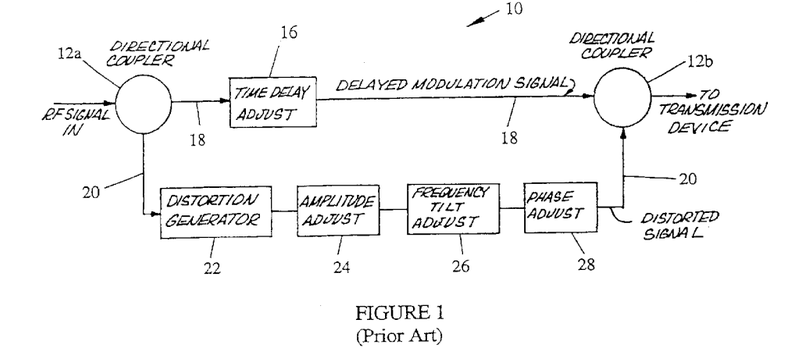
FIG. 1 is block diagram of a predistortion circuit which is representative of FIG. 1 from U.S. Pat. No. 4,992,754, illustrating the overall design including its use of directional couplers.
Figure 2:
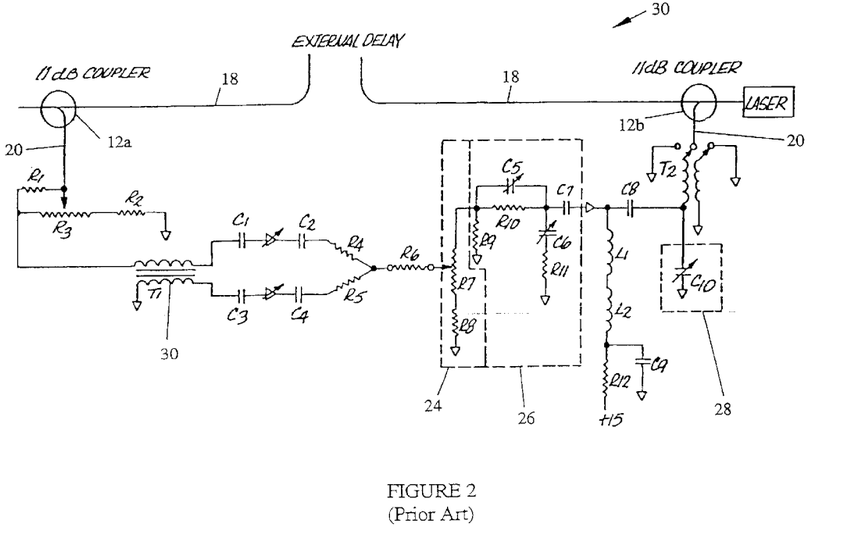
FIG. 2 is a schematic diagram of the circuit shown in FIG. 1 and is representative of FIG. 3 from U.S. Pat. No. 4,992,754, illustrating again the use of directional couplers as well as other magnetic components.

FIGS. 1 and 2 correspond to FIGS. 1 and 3, respectively, taken from the '754 patent with reference numbers applied to the FIGS. consistent with the present description. FIG. 1 illustrates a prior art predistortion arrangement generally indicated by the reference number 10. Arrangement 10 includes input and output directional couplers 12a and 12b, respectively, a time delay circuit 16 in a signal path 18 and a distortion path 20. The latter includes a distortion generator 22, an amplitude adjust section 24, a frequency tilt adjust section 26 and a phase adjust section 28 arranged in series along distortion path 20.

Referring to FIG. 2, the '754 patent contemplates an implementation 30 of the block diagram of FIG. 1, however, no provision is made for distortion generator 22 (see FIG. 1). Implementation 30 does provide distortion path 20 including amplitude adjust section 24, frequency tilt adjust section 26 and phase adjust section 28 all of which are indicated within dashed lines. A detailed accounting of the components in FIG. 2 is not necessary for reasons which will become evident, however, the presence of certain components should be noted. Specifically, a number of magnetic/inductive components are present. In particular, directional couplers 12a and 12b are normally implemented using transformers. Also, distortion path 20 includes a transformer 30 serving as a signal splitter, inductors L1 and L2 following frequency tilt adjust section 26 and a transformer T2 connected to directional coupler 12b. As will be seen, the presence of these inductive components is considered to be particularly disadvantageous in accordance with the teachings of the present invention.

Figure 3:
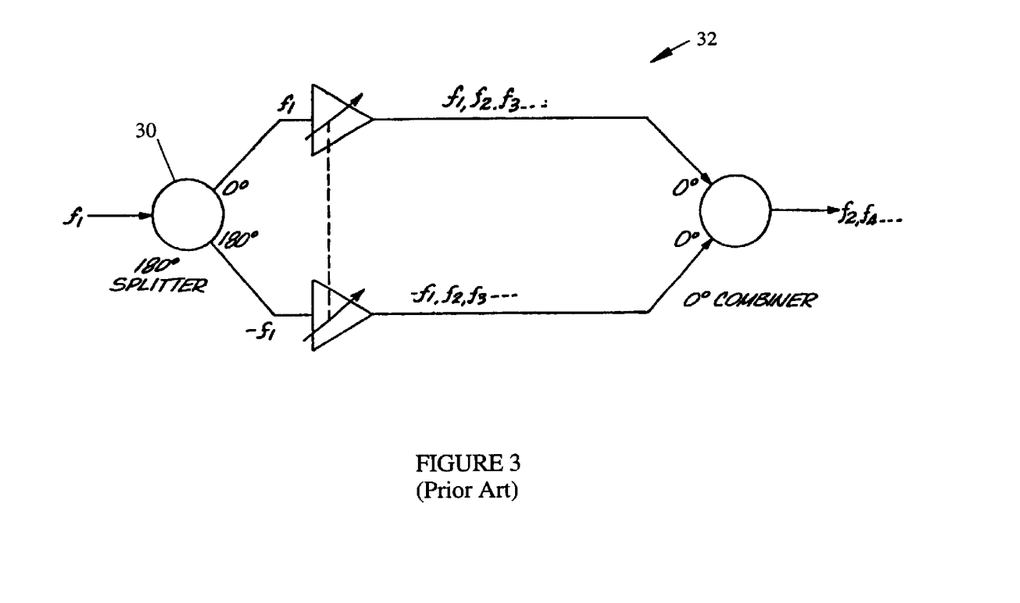
FIG. 3 is a schematic diagram of a distortion amplifier which is representative of FIG. 2 from U.S. Pat. No. 4,992,754, shown here to illustrate the use of a transformer in the amplifier.

Referring to FIG. 3, which corresponds to FIG. 2 of the '754 patent having reference numbers applied consistent with the present description, one implementation of a distortion amplifier (see item 22 in FIG. 1) is illustrated in the form of a push-push amplifier generally indicated by reference number 32. Once again, it is of interest here that amplifier 32 includes aforementioned splitter transformer 30. It is submitted that the specific implementations used in the '754 patent, and in the prior art generally, share at least one disadvantage related to requirements for magnetic components which, in turn, imposes limitations on the adaptability of predistortion in compensating for the nonlinearity of electro-optical devices, as will be further described.

The present invention provides a highly advantageous drive arrangement utilizing a predistortion for driving nonlinear electro-optical devices in a heretofore unseen manner which resolves the foregoing limitations.

SUMMARY OF THE INVENTION

As will be described in more detail hereinafter, there is disclosed herein a predistortion arrangement. This arrangement, like the prior art circuits illustrated in FIGS. 1–3, develops predistortion for using an input signal to drive a nonlinear device having a drive input. However, the present invention includes first means for sampling a portion of the input signal. The sampled portion of the input signal is introduced to at least one predistortion path including a mixer responsive to the sampled portion of the input signal for producing at least second order intermodulation products of the input signal. The second order intermodulation products are then conditioned. Combining means then combine the conditioned second order intermodulation products with the sampled input signal in a way which produces a predistorted drive signal compensated for second order distortion for use in driving the drive input of the nonlinear device.

In one aspect of the invention, the sampling means and the combining means are provided using resistive networks. In one feature, the use of the resistive networks eliminates the need for directional couplers incorporating magnetic components. Accordingly, in one feature, the predistortion arrangement including the mixer and the resistive networks may be provided in the form of an integrated circuit.

In another aspect of the invention, higher order intermodulation products may be generated using one or more additional predistortion paths, each of which relies on the use of mixers to generate the higher order intermodulation products.

BRIEF DESCRIPTION OF THE DRAWINGS

The present invention may be understood by reference to the following detailed description taken in conjunction with the drawings briefly described below.

DETAILED DESCRIPTION OF THE INVENTION

Figure 4:
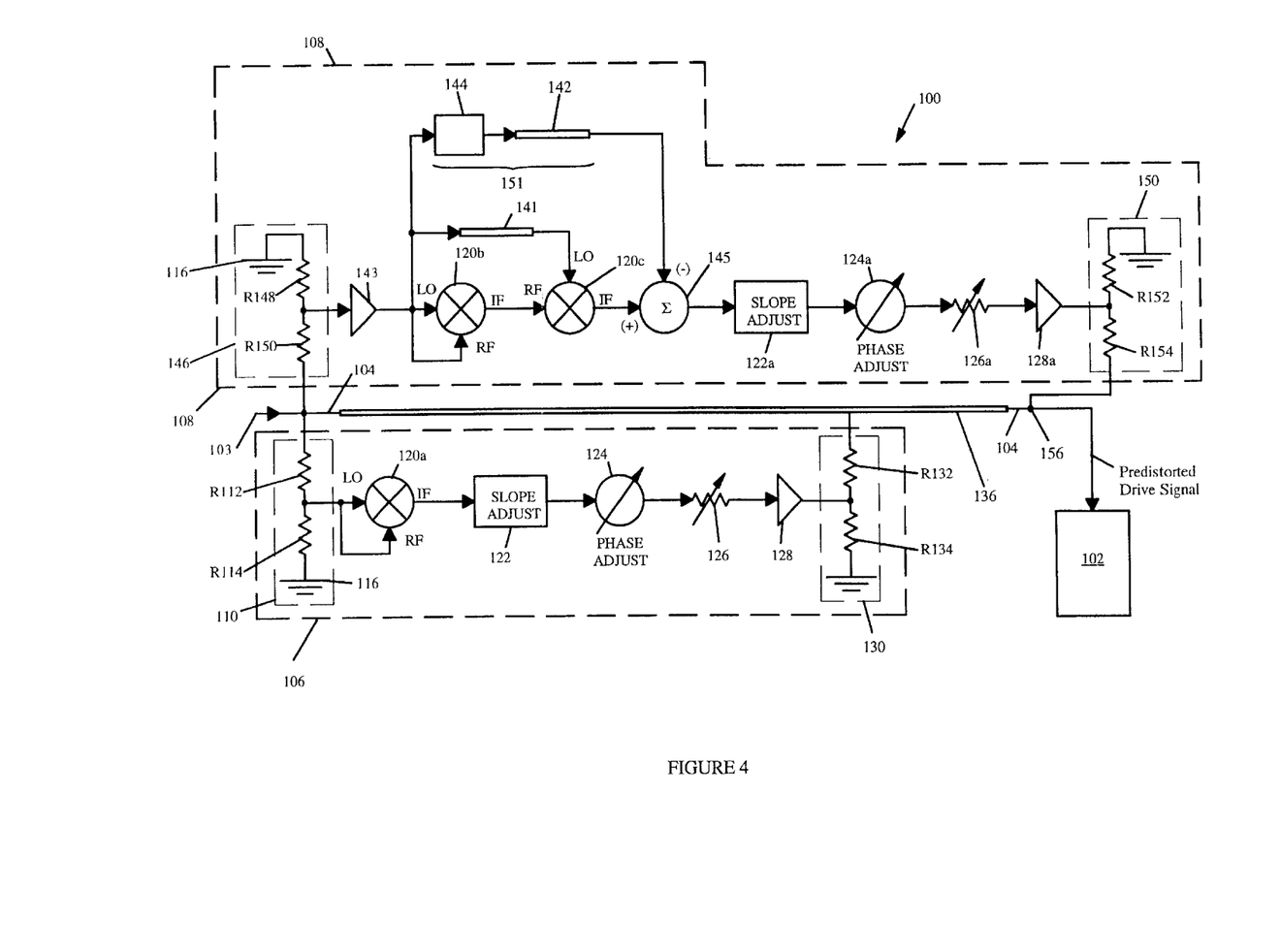
FIG. 4 is a block diagram of a predistortion arrangement manufactured in accordance with the present invention, shown here to illustrate the components of the overall arrangement.

Having previously described FIGS. 1–3, attention is immediately directed to FIG. 4 which illustrates a predistortion arrangement manufactured in accordance with the present invention and generally indicated by the reference numeral 100 for use in driving a nonlinear electro-optical device 102 such as, for example, a laser diode or modulator. Arrangement 100 includes an input 103 into which a suitable RF signal is fed. The signal may comprise a broad band signal for use in modulating the intensity of the output of the particular nonlinear electro-optical device 102 to be driven. As one example, a broad band signal may comprise television signals, in accordance with the NTSC standard. The overall bandwidth of the signal may be 860 MHz or more encompassing 128 or more NTSC signals. It is to be understood that the NTSC standard is used herein for exemplary purposes only and that any suitable signal format may be employed.

Predistortion arrangement 100 includes a fundamental signal path 104 and one or more predistortion paths. In the present example, a first predistortion path is indicated within a dashed line designated by the reference number 106 while a second predistortion path is indicated within another dashed line designated by the reference number 108. The first predistortion path generates intermodulation products of the second order while the second predistortion path generates intermodulation products of the third order. Therefore, first predistortion path 106 may be referred to as a second order products path while second predistortion path 108 may be referred to as a third order products path. The first predistortion path will be discussed in detail immediately hereinafter.

Still referring to FIG. 4, first predistortion path 106 includes a resistive voltage divider network 110 indicated within a dashed line made up of resistors R112 and R114 connected from fundamental signal path 104 in series to a ground 116. An attenuated signal is taken from the junction of resistors R112 and R114 and provided to the Local Oscillator (hereinafter LO) input of a mixer 120*a*. At the same time, the attenuated signal is also provided to the Radio Frequency (hereinafter RF) input of mixer 120*a*. In accordance with the present invention, mixer 120*a* functions in a broad band manner to generate second order intermodulation products at the Intermediate Frequency (hereinafter IF) output. Presently, it is preferred to use a double balanced active mixer as mixer 120 for reasons including high LO-EF isolation, and RF-IF isolation. In a preferred embodiment, a Gilbert cell design is utilized such as is incorporated in the IAM-81008 mixer which is available from Hewlett-Packard. A double balanced active mixer design includes characteristics of high gain and relatively high isolation between the IF output and RF and/or LO inputs. Irrespective of the specific mixer which is used, it is important to note that the present application requires the ability to produce intermodulation products corresponding to a broad bandwidth. Therefore, the use of mixer 120*a* in this application causes concerns to arise which are not present in frequency limited applications such as that of doubling of a particular frequency. These concerns include bandwidth capabilities of the mixer as well as the phase linearity of the mixer. It is to be understood that any mixer design, either currently available or to be developed, is contemplated for use herein so long as the requisite characteristics are provided.

Second order intermodulation products produced at the IF output of mixer 120*a* are passed to a series of compensation sections which prepare the second order intermodulation products for proper combination with the fundamental signal. Initially, the second order intermodulation products are provided to a slope adjust section 122 which compensates for amplitude variations occurring with respect to frequency change. Following slope adjust compensation, the second order intermodulation products enter a phase adjust compensation section 124 and, thereafter, pass through an amplitude compensation section 126 which is followed by an amplifier 128. It should be noted that amplifier 128 is considered as optional for reasons to be explained at an appropriate point below. It is noted that the compensation sections may be arranged in a different order than that illustrated. A specific implementation of the compensation sections will be described below.

Continuing to refer to FIG. 4, the second order intermodulation products are then provided to an output resistive network 130 indicated within a dashed line and including resistors R132 and R134. The second order intermodulation products are coupled into a delay line 136 on the fundamental signal path. The purpose of delay line 136 is to introduce a delay along the fundamental signal path which matches the delay of the second order products along first predistortion path 106. FIG. 4 illustrates connection of output resistive network 130 in a tapped manner to the overall delay line 136. Such a tapped delay line may be provided, for example, using a microstrip line formed on a printed circuit board. As illustrated, the line may be tapped so as to provide further delay for another portion of the circuitry.

Still referring to FIG. 4, third order distortion products path 106 is similar to the second order path with the addition of a number of components. Specifically, the additional components include delay lines 141 and 142, an amplifier 143, an attenuator 144, a summing section 145 and another mixer. It is noted that all of the mixers used herein may include the same part number and, therefore, have been identified with the common reference number 120, but with a different letter appended to this common reference number for purposes of clarity. Therefore, the mixers in the third order path have been identified using the reference numbers 120*b* and 120*c*. An input resistive network 146 within a dashed line includes resistors R148 and R150 and provides a portion of the overall input signal to amplifier 143. The amplified portion of the input signal is then fed to mixer 120*b* which produces second order intermodulation products in the same manner as mixer 120*a*, described above, by providing the same input signal to the RF and LO inputs of the mixer. The second order intermodulation products produced at the IF output of mixer 120*b* are then fed to the RF input of mixer 120*c*. The latter also receives, at its LO input, the amplified portion of the input signal delayed by delay line 141. Delay line 141 includes an electrical length matching the electrical length of mixer 120*b* so that the signal arrives at mixer 120*c* with the proper phase.

Using the second order products and the delayed amplified portion of the input signal, mixer 120*c* generates third order intermodulation products at its IF output. Once again, it is important to understand that third order products should be produced corresponding to the entire bandwidth of the fundamental signal. In this regard, the concerns discussed above with regard to the use of mixer 120*a* in the second order products path are of even more concern since the required bandwidth and phase linearity are more difficult to achieve with the cascade of two mixers than with the single mixer used for generating second order products. The third order intermodulation products are then received by the non-inverting input, (+), of summing section 145. Further suppression of the fundamental signal is achieved by using attenuator 144 and delay line 142 in cooperation with summing section 145, serving as a fundamental cancellation network 151. The need for fundamental cancellation using attenuator 144, delay line 142 and summing section 145 will be addressed at an appropriate point below. For the moment, it should be mentioned that the present invention contemplates provisions for fundamental cancellation in any suitable manner in the third order products path. Moreover, it is noted that the implementation of summing section 145, attenuator 144 and delay line 142, for example, in the form of a microstrip line, is considered to be within the skill of one of ordinary skill in the art.

During the operation of the third order products path, attenuator 144 receives a portion of the fundamental signal and reduces its level to an appropriate attenuated value. The attenuated fundamental signal is then delayed by delay line 142 which is configured to match the delay encountered by the fundamental signal and accountable to mixers 120b and 120c in producing the third order products. The attenuated fundamental signal is provided to an inverting input, (−), of summing section 145. With an appropriate level of the fundamental signal present in the summing section, the fundamental or base band signal is substantially canceled so as to avoid a significant interaction with nonlinearities in the compensation sections which follow on the third order products path.

Still describing the third order products path, the compensation sections in the third order products path are functionally equivalent to the series of compensation sections included in the second order distortion path and, therefore, are designated using identical reference numbers with the letter "a" appended thereto. Accordingly, these compensation sections are indicated as slope adjust section 122a, phase adjust compensation section 124a and amplitude compensation section 126a, which are followed by an amplifier 128a. As mentioned above with regard to amplifier 128, amplifier 128a is considered as being optional. It is to be understood that design details of these compensation sections within the third order products path may differ with regard to corresponding sections in the second order products path, for example, due to the need to compensate for the additional components in the third order path and the differences between the second and the third order distortion produced in the nonlinear device to be predistorted. It should also be understood that the present invention contemplates using other products paths to produce higher order (i.e., greater than third order) products by adding mixers, for example, to third order path 108 of FIG. 3.

From amplifier 128a, the third order products are provided to an output resistive network 150 comprised of resistors R152 and R154 which introduces the third order products back onto the fundamental signal line for combining with the fundamental signal and with the second order products at a point 156 following delay line 136. It is noted that the delay introduced between the tap at which the second order products are introduced to the fundamental signal path and point 156 may be in the form of a separate delay line having an appropriated lumped value. The final predistorted drive signal is then provided to non-linear electro-optical device 102.

Having generally described the structure of predistortion arrangement 100, attention is now directed to specific details of its operation with attendant advantages. First considering second order predistortion path 104, it should be appreciated that mixer 120, as specified, provides significant levels of isolation of the fundamental signal in the compensation section of the path. That is, mixer 120a reduces the level of the fundamental signal at its IF output to a level at least 20 dB below the level of the second order intermodulation products. It is recognized herein that this reduction in the fundamental signal is attributable to the fourier transform of the square of the fundamental signal having only second order terms and a DC term, which is easily eliminated, and the high RF-IF and LO-IF isolation of the mixer. As one advantage associated with this low fundamental level, any of the various functional blocks along the second order products path i.e., slope adjust section 122, phase adjust section 124 and amplitude adjust section 126, may be permitted to exhibit some degree of nonlinearity above levels which would normally be considered as being acceptable, since the overall effect of such nonlinearity is directly dependent upon the level of the fundamental signal with which it is interacting. That is, the lower the fundamental signal, the more nonlinearity may be permitted. One advantage of the present invention, therefore, is the ability to use lower cost components in the compensation sections. Another advantage, when implementing a voltage controlled compensation circuit, is the ability to reduce current consumption of the compensation network.

Referring to FIGS. 1 and 4, the directional couplers shown in FIG. 1 rovide the following functions: (1) they efficiently sample and inject signal; (2) coupler 12a isolates the device to be predistorted from distortion reflected from the distortion generator (item 22 in FIG. 1); and (3) coupler 12b isolates the distortion compensation network (items 24, 26, 28 in FIG. 1) from the fundamental signal. This is important for reasons described previously. All of these functions can be performed by resistive splitters and combiners if extra gain is provided in the distortion path. Active mixer 120a in FIG. 4, such as a Gilbert cell, is highly desirable for providing this extra gain. Moreover, if additional isolation of the distortion compensation network is desired, amplifier 128 may be added and R132 adjusted. This may be necessary if a high level of second order predistortion is required, if the distortion compensation network has too much loss, or if highly nonlinear components are used in the distortion compensation network.

Still considering second order predistortion path 104, it should be appreciated that the combination of mixer 120 with input resistive network 110 and, in fact, with output resistive network 130 is highly advantageous. The use of output resistive network 130 is facilitated as a result of the gain of mixer 120a. Inherently, the resistive networks advantageously provide no frequency dependent attenuation which would serve to reduce bandwidth. It should be appreciated that amplifier 128 is considered as optional in view of specific values chosen for R132 and R134. That is, if the value of R132 is great enough, leakage of the fundamental signal into the compensation sections has been found to be at an acceptable level without the need for amplifier 128. This holds even in instances where more significant levels of nonlinearity are permitted in the compensation section, as described above. Still further advantages associated with the combination of mixer 120a and the resistive networks will be described.

With continuing reference to FIG. 4, attention is again directed to third order products path 108. While the fundamental signal is suppressed to a level significantly below that of the second order products produced by mixer 120b, this level of suppression is not possible in the products of mixer 120c. The output of mixer 120c is the cube of the fundamental signal. The Fourier transform of the cube of the fundamental has 9.5 dB more power in the fundamental than in the desired third order products. Therefore, further suppression of the fundamental signal is desirable. Fundamental cancellation network 151 has been found to be suitable in this application not only for the reason that sufficient cancellation is achieved, but also since the use of magnetic components (i.e., inductors) is avoided, as will be further discussed. Moreover, with the addition of fundamental cancellation network 151, it is considered that the third order products path shares the advantages of the second order products path. For as example, if the value of R154 is great enough, leakage of the fundamental signal into the third order path compensation sections has been found to be at an acceptable level without the need for amplifier 128a. However, the values of R152 and R154 may be adjusted in view of isolation, and gain provided in the presence of amplifier 128a as described above with regard to amplifier 128.

Referring to FIGS. 1 and 2, the reader is reminded of the discussions above relating to the '754 patent. The latter utilizes directional couplers 12a and 12b which do provide isolation of the fundamental signal. At first appearance, therefore, the use of directional couplers seems advantageous since isolation is provided. However, in accordance with the present invention, the use of directional couplers is considered to be unacceptable for a number of reasons, irrespective of isolation provided thereby. One reason for which it is desirable to avoid the use of directional couplers resides in their cost. The resistive networks used herein are insignificant in cost as compared with directional couplers. An even more compelling reason for using the configuration disclosed by the present invention will be described immediately hereinafter.

Referring to FIGS. 1, 2 and 4, as mentioned previously, directional couplers 12a and 12b (FIGS. 1 and 2) are typically implemented using magnetic components. The present invention recognizes that the use of these components is particularly disadvantageous since present technologies are incapable of providing such magnetic components as part of an overall integrated circuit. That is, if a predistortion circuit is to be provided in the compact form of an integrated circuit, the need for directional couplers should be eliminated. The predistortion arrangement of the present invention, as depicted in FIG. 4, serves this purpose. The combination of mixer 120 with the input and output resistive networks is readily provided in integrated circuit form. Moreover, predistortion arrangement 100 has also eliminated the need for other inductive components such as the transformers which are used in the predistortion path of the '754 patent while providing still further advantages through the manner in which the compensation circuitry is implemented along the predistortion path.

Figure 5:
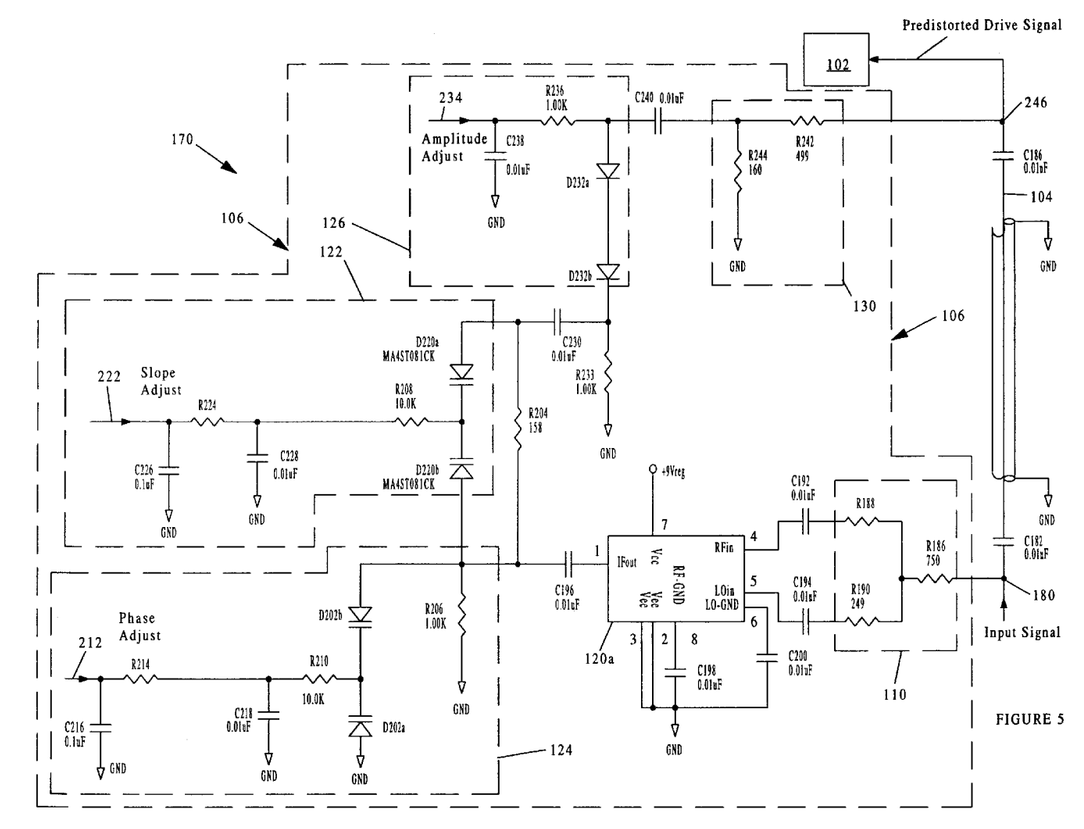
FIG. 5 is a schematic diagram of one embodiment of a second order products path, manufactured in accordance with the present invention, which may form part of the arrangement of FIG. 4, shown here to illustrate details of its construction.

Attention is now directed to FIG. 5 which illustrates one embodiment of a predistortion arrangement for generating second order products which is manufactured in accordance with the present invention and generally indicated by the reference number 170. For purposes of clarity, reference numbers corresponding to like components in FIG. 4 will be used whenever possible. Second order intermodulation products path 106 is indicated and forms part of drive arrangement 170. During operation, the fundamental signal enters the predistortion path at a junction 180 of capacitor C182 and resistor R184. Capacitors C182 and C186 block DC from either end of delay line 136. Input resistive network 110 sends most of the fundamental signal through adjustable delay line 136 along primary path 104, however, a small amount of the fundamental signal is coupled into the RF (pin no. 4) and LO (pin no. 5) ports of Gilbert cell mixer 120a by resistors R184, R188, and R190. These latter resistors are preferably selected to drive the RF port of the mixer harder than the LO port since the LO port is buffered internal to the mixer. It is noted that the configuration of input resistive network 110 varies slightly from its configuration in FIG. 4. Such modifications are considered as within the scope of the present invention. C192, C194 and C196 are DC blocking capacitors for the RF, LO, and IF (pin no. 1) ports of Gilbert mixer 120a. C198 and C200 provide a suitable RF ground below 50 MHz. Second order intermodulation products are produced at the IF output of mixer 120a (pin no. 1).

Still referring to FIG. 5, the second order products then pass through phase adjust section 124, slope adjust section 122 and amplitude adjust section 126. Phase adjust section includes varactors D202a and D202b. Resistors R204, R206, R208 and R210 are needed to bias the varactors in both phase adjust section 124 and slope adjust section 122. An external phase control voltage is provided on a line 212. The control voltage is coupled through R214 and filtered by capacitors C216 and C218. Slope adjust section 122 includes varactors D220a and D220b. An external slope adjust signal is provided on a line 222 and is filtered by resistor R224 cooperating with capacitors C226 and C228. Capacitor C230 serves as a DC block and couples the second order products signal to amplitude adjust section 126.

Continuing with a description of predistortion arrangement 170, the amplitude of the second order products is adjusted using a pin diode attenuator including PIN diodes D232a and D232b that are biased by a resistor R233. Note that amplifier 128 (FIG. 2) is not used here. An external amplitude control voltage is provided on a line 234 via resistor R236 and capacitor C238 for biasing the PIN diodes. Capacitor C240 couples the second order products to output resistive network 130 which is made up of resistors R242 and R244. As mentioned above and in this example, the gain of mixer 120a allows use of a relatively large resistance for R242 in the absence of amplifier 128 (FIG. 4) for limiting the leakage of the fundamental signal in the reverse direction into the compensation sections. Thus, the second order products are combined with the fundamental signal at a point 246 along primary path 104 following delay line 136.

Having described predistortion arrangement 170, it should be mentioned that the phase, slope and amplitude adjustments provided thereby are somewhat interactive. However, it should be appreciated that implementation of the circuit in a way which provides for an external control voltage for each section is highly advantageous since computer control is readily providable to these control lines. At the same time, as a result of the high isolation performance provided by mixer 120a, this external control configuration overcomes the difficulty inherent in the introduction of nonlinearity exhibited by the varactor diodes.

Referring to FIGS. 4 and 5, while predistortion arrangement 170 has been implemented using discrete components, it is to be understood that the entirety of the arrangement, with the present exception of delay line 136, may be provided in the form of an integrated circuit. The latter may include a configuration which is different from the specific configuration shown in FIG. 5 so long as equivalent functionality is achieved. Moreover, the present invention contemplates providing the entirety of predistortion arrangement 100 (FIG. 4), with the possible exception of its delay lines, in the form of an integrated circuit. In this regard, as described above, such integration is accomplished through the elimination of inductive components by using mixers in combination with resistive networks in the highly advantageous manner described above. Delay lines may be provided, for example, in the form of microstrip lines arranged in proximity to a predistortion integrated circuit that is manufactured in accordance with the present invention or by a coaxial cable.

Since the predistortion arrangement disclosed herein may be provided in a variety of different configurations, it should be understood that the present invention may be embodied in many other specific ways without departing from the spirit or scope of the invention. Therefore, the present examples and methods are to be considered as herein, but may be modified within the scope of the appended claims.

What is claimed is:

1. A drive arrangement for use in an overall system including a nonlinear electro-optical device having a drive input to be operated using an input signal, said arrangement comprising:

a) first means for sampling a portion of said input signal;
   b) at least one predistortion path including a double balanced mixer responsive to the sampled portion of the input signal to produce at least second order intermodulation products of the input signal and for conditioning the second order intermodulation products in a predetermined way; and
   c) combining means for combining the conditioned second order intermodulation products with the sampled input signal in a way which produces a predistorted drive signal compensated for second order distortion that is provided to the drive input of said nonlinear electro-optical device.

2. A drive arrangement for use in an overall system including a nonlinear electro-optical device having a drive input to be operated using an input signal, said arrangement comprising:

a) first means for sampling a portion of said input signal;
   b) at least one predistortion path including a mixer responsive to the sampled portion of the input signal to produce at least second order intermodulation products of the input signal and for conditioning the second order intermodulation products in a predetermined way; and
   c) combining means for combining the conditioned second order intermodulation products with the sampled input signal in a way which produces a predistorted drive signal compensated for second order distortion that is provided to the drive input of said nonlinear electro-optical device; and wherein said mixer includes an RF input, and LO input and an IF input and wherein the RF and LO inputs both receive the sampled input signal such that the second order intermodulation products are produced at said IF output.

3. The drive arrangement of claim 2 wherein said mixer is a Gilbert cell mixer.

4. The drive arrangement of claim 1 wherein said combining means includes delay means which delays the sampled input signal before combining the conditioned second order intermodulation products in a way which compensates for any delays produced in said predistortion path.

5. The drive arrangement of claim 1 wherein said sampling means includes a resistive voltage divider network for sampling said portion of the input signal without the use of magnetic components.

6. The drive arrangement of claim 3 wherein said mixer and said resistive voltage divider network are provided as part of an integrated circuit.

7. A drive arrangement for use in an overall system including a nonlinear electro-optical device having a drive input to be operated using an input signal, said arrangement comprising:

a) first means for sampling a portion of said input signal;
   b) at least one predistortion path including a mixer responsive to the sampled portion of the input signal to produce at least second order intermodulation products of the input signal and for conditioning the second order intermodulation products in a predetermined way; and
   c) combining means for combining the conditioned second order intermodulation products with the sampled input signal in a way which produces a predistorted drive signal compensated for second order distortion that is provided to the drive input of said nonlinear electro-optical device; and wherein said combining means includes a resistive voltage divider network for combining the conditioned second order intermodulation products with said portion of the input signal.

8. The drive arrangement of claim 7 wherein said mixer and said resistive voltage divider network are provided as part of an integrated circuit.

9. The drive arrangement of claim 7 wherein said conditioned second order intermodulation products are combined with said portion of the input signal by first using delay means to delay the sampled input signal in a way which compensates for any delays produced in said predistortion path prior to combining the conditioned second order intermodulation products with said portion of the input signal in said resistive voltage divider network.

10. A drive arrangement for use in an overall system including a nonlinear electro-optical device having a drive input to be operated using an input signal, said arrangement comprising:

a) first means for sampling a portion of said input signal;
    b) at least one predistortion path including a mixer responsive to the sampled portion of the input signal to produce at least second order intermodulation products of the input signal and for conditioning the second order intermodulation products in a predetermined way; and
    c) combining means for combining the conditioned second order intermodulation products with the sampled input signal in a way which produces a predistorted drive signal compensated for second order distortion that is provided to the drive input of said nonlinear electro-optical device; and wherein said distortion path including said mixer is provided as part of an integrated circuit.

11. The drive arrangement of claim 10 wherein said sampling means is provided as part of said integrated circuit.

12. The drive arrangement of claim 11 wherein said combining means includes a resistive network provided as part of said integrated circuit for combining the conditioned second order intermodulation products with said portion of the input signal.

13. The drive arrangement of claim 1 wherein said predistortion path includes at least one module for conditioning the second order intermodulation products, said module including a configuration which provides for external control of said conditioning.

14. The drive arrangement of claim 13 wherein said module includes at least one varactor responsive to said external control.

15. The drive arrangement of claim 14 wherein said varactor is a semiconductor varactor diode.

16. A drive arrangement for use in an overall system including a nonlinear electro-optical device having a drive input to be operated using an input signal, said arrangement comprising:

a) first means for sampling a portion of said input signal;

b) at least one predistortion path including a mixer responsive to the sampled portion of the input signal to produce at least second order intermodulation products of the input signal and for conditioning the second order intermodulation products in a predetermined way;

c) combining means for combining the conditioned second order intermodulation products with the sampled input signal in a way which produces a predistorted drive signal compensated for second order distortion that is provided to the drive input of said nonlinear electro-optical device;

d) second means for sampling another portion of said input signal;

e) at least one additional predistortion path including at least first and second additional, double balanced, mixers for using the other sampled portion of the input signal to produce higher order intermodulation products of the input signal which are higher in order than the second order intermodulation products and for conditioning the higher order intermodulation products in said predetermined way; and f) additional combining means for combining the conditioned higher order intermodulation products with the sampled input signal in a way which produces said predistorted drive signal compensated for the higher order distortion that is provided to the drive input of said nonlinear electro-optical device.

17. The drive arrangement of claim 16 wherein said additional mixers include an RF input, an LO input and an IF input and wherein the RF and LO inputs of the first additional mixer receive the sampled other portion of said input signal to generate second order intermodulation products at the IF output of said first additional mixer for use by the second additional mixer.

18. The drive arrangement of claim 17 wherein the RF input of said second additional mixer receives said second order intermodulation products from the IF output of said first additional mixer and the LO input of said second additional mixer receives the sampled other portion of the input signal to generate third order intermodulation products as said higher order intermodulation products at the IF output of said second additional mixer.

19. The drive arrangement of claim 16 wherein said additional combining means includes additional delay means which delays the sampled input signal combined with the second order intermodulation products before combining the conditioned third order intermodulation products with the conditioned second order intermodulation products and the sampled input signal in a way which compensates for any delays produced in the additional predistortion path.

20. The drive arrangement of claim 16 wherein said first and second additional mixers are Gilbert cell mixers.

21. A drive arrangement for use in an overall system including a nonlinear electro-optical device having a drive input to be operated using an input signal, said arrangement comprising:

a) first means for sampling a portion of said input signal;

b) at least one predistortion path including a double balanced mixer for using the sampled portion of the input signal to produce second or higher order intermodulation products of the input signal and for conditioning the higher order intermodulation products in a predetermined way; and c) combining means for combining the conditioned higher order intermodulation products with the sampled input signal in a way which produces a predistorted drive signal compensated for higher order distortion that is provided to the drive input of said nonlinear electro-optical device.

* * * * *

UNITED STATES PATENT AND TRADEMARK OFFICE
CERTIFICATE OF CORRECTION

PATENT NO. : 6,519,374 B1
DATED : February 11, 2003
INVENTOR(S) : Christopher Robert Stook and Stephen Bradley Krasulick It is certified that error appears in the above-identified patent and that said Letters Patent is hereby corrected as shown below:

<u>Title page</u>,
Item [73], Assignee, delete "Uniphase Corporation, San Jose, CA (US)" add
-- JDS Uniphase Corporation, San Jose, CA (US) --

Signed and Sealed this

Fourth Day of November, 2003

JAMES E. ROGAN
*Director of the United States Patent and Trademark Office*